(12) United States Patent
Usuda et al.

(10) Patent No.: US 9,391,105 B2
(45) Date of Patent: Jul. 12, 2016

(54) SOLID-STATE IMAGING DEVICE AND IMAGING APPARATUS

(71) Applicant: PANASONIC CORPORATION, Osaka (JP)

(72) Inventors: Manabu Usuda, Hyogo (JP); Shigeru Saitou, Kyoto (JP); Keisuke Tanaka, Toyama (JP); Kazutoshi Onozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 8 days.

(21) Appl. No.: 14/140,365

(22) Filed: Dec. 24, 2013

(65) Prior Publication Data

US 2014/0103478 A1    Apr. 17, 2014

Related U.S. Application Data

(63) Continuation of application No. PCT/JP2012/004131, filed on Jun. 26, 2012.

(30) Foreign Application Priority Data

Jul. 8, 2011   (JP) ................................. 2011-152279

(51) Int. Cl.
*H01L 27/146*   (2006.01)
*H04N 5/357*   (2011.01)

(52) U.S. Cl.
CPC .... *H01L 27/14625* (2013.01); *H01L 27/14621* (2013.01); *H04N 5/3572* (2013.01)

(58) Field of Classification Search
CPC . H04N 5/3696; H01L 27/146; H01L 31/0232

USPC .......................................... 257/432; 348/284
See application file for complete search history.

(56) References Cited

U.S. PATENT DOCUMENTS 5,751,492 A    5/1998  Meyers
6,831,687 B1*  12/2004  Suzuki .......................... 348/251
(Continued)

FOREIGN PATENT DOCUMENTS

JP    01-213079 A    8/1989
JP    10-084104 A    3/1998
(Continued)

OTHER PUBLICATIONS

International Search Report issued in PCT/JP2012/004131, dated Jul. 31, 2012.

*Primary Examiner* — Su C Kim
*Assistant Examiner* — David S Wilbert
(74) *Attorney, Agent, or Firm* — McDermott Will & Emery LLP

(57) ABSTRACT

A solid-state imaging device includes: unit pixels each having a light-receiving element which is divided into line widths shorter than or equal to a wavelength of light; a plurality of light-transmissive films in a concentric structure; and an effective refractive index distribution. Among the light-transmissive films, a light-transmissive film closest to a center of the concentric structure has an outer edge in a shape of a true circle, and a light-transmissive film far from the center of the concentric structure has an outer edge in a shape of an oval, a ratio of a long axis to a short axis of the oval increases as the light-transmissive film is farther away from the center of the concentric structure, and a direction of the long axis of the oval is orthogonal to a vector which connects the center of the concentric structure and a center of the solid-state imaging device.

15 Claims, 14 Drawing Sheets

(56) References Cited

U.S. PATENT DOCUMENTS

| | | | |
|---|---|---|---|
| 7,663,084 B2 | 2/2010 | Toshikiyo et al. | |
| 7,667,286 B2 * | 2/2010 | Toshikiyo | G02B 5/1876 257/294 |
| 7,692,129 B2 | 4/2010 | Toshikiyo et al. | |
| 7,718,949 B2 * | 5/2010 | Toshikiyo | H01L 27/14632 250/216 |
| 8,004,595 B2 * | 8/2011 | Onozawa | H01L 27/14627 348/273 |
| 8,018,508 B2 * | 9/2011 | Toshikiyo | G02B 5/1876 250/208.1 |
| 8,054,350 B2 * | 11/2011 | Kyung | H04N 5/217 348/251 |
| 8,310,622 B2 * | 11/2012 | Ha | G02B 3/0006 349/64 |
| 8,384,009 B2 * | 2/2013 | Toda | G02B 5/188 250/216 |
| 2006/0066743 A1 * | 3/2006 | Onozawa | H04N 5/2254 348/340 |
| 2006/0284052 A1 * | 12/2006 | Toshikiyo et al. | 250/208.1 |
| 2006/0285228 A1 * | 12/2006 | Ishii et al. | 359/742 |
| 2007/0164329 A1 * | 7/2007 | Toshikiyo | G02B 3/08 257/291 |
| 2008/0011937 A1 * | 1/2008 | Toshikiyo | 250/208.1 |
| 2008/0029701 A1 * | 2/2008 | Onozawa | B60Q 1/0023 250/332 |
| 2008/0076039 A1 * | 3/2008 | Ishii | G03F 7/0005 430/5 |
| 2009/0020840 A1 | 1/2009 | Toshikiyo et al. | |
| 2009/0141153 A1 * | 6/2009 | Onozawa | H01L 27/14627 348/294 |
| 2011/0221022 A1 * | 9/2011 | Toda | G02B 5/188 257/432 |

FOREIGN PATENT DOCUMENTS

| | | |
|---|---|---|
| JP | 2006-351972 A | 12/2006 |
| JP | 2009-135236 A | 6/2008 |
| JP | 2012-094601 A | 5/2012 |
| JP | 2012-109468 A | 6/2012 |

* cited by examiner

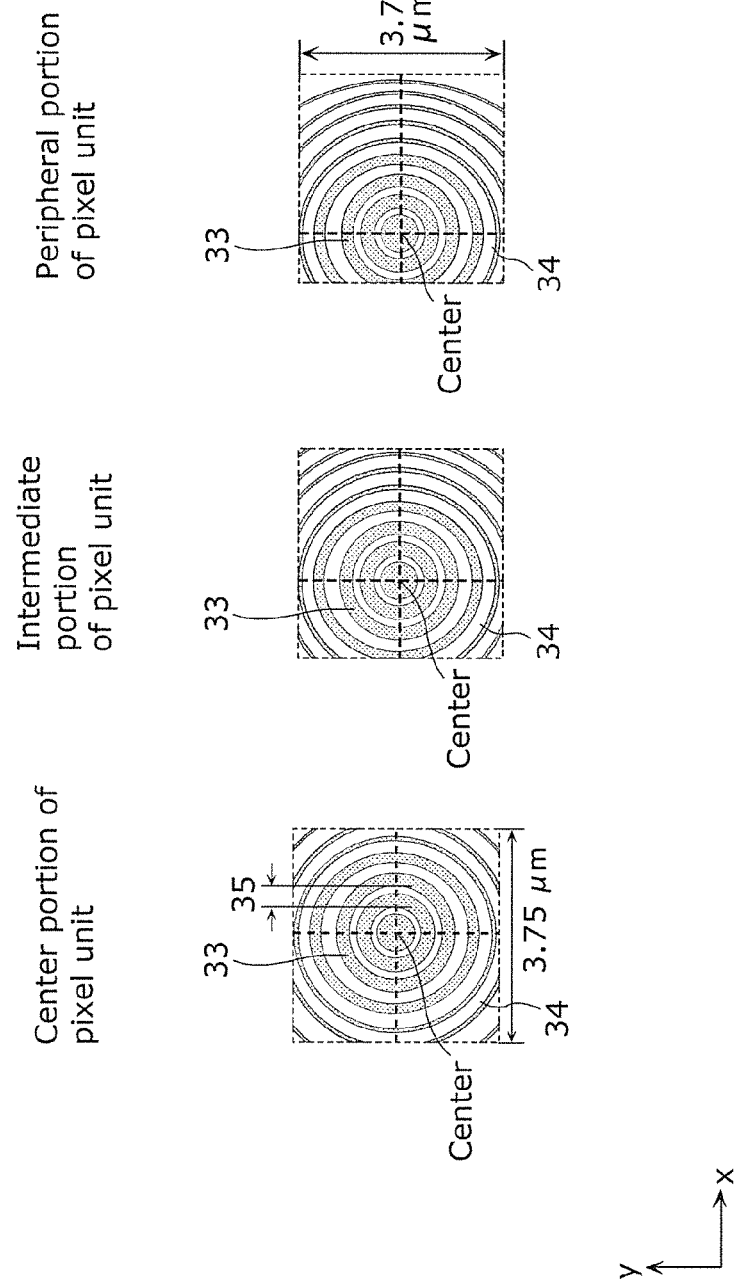

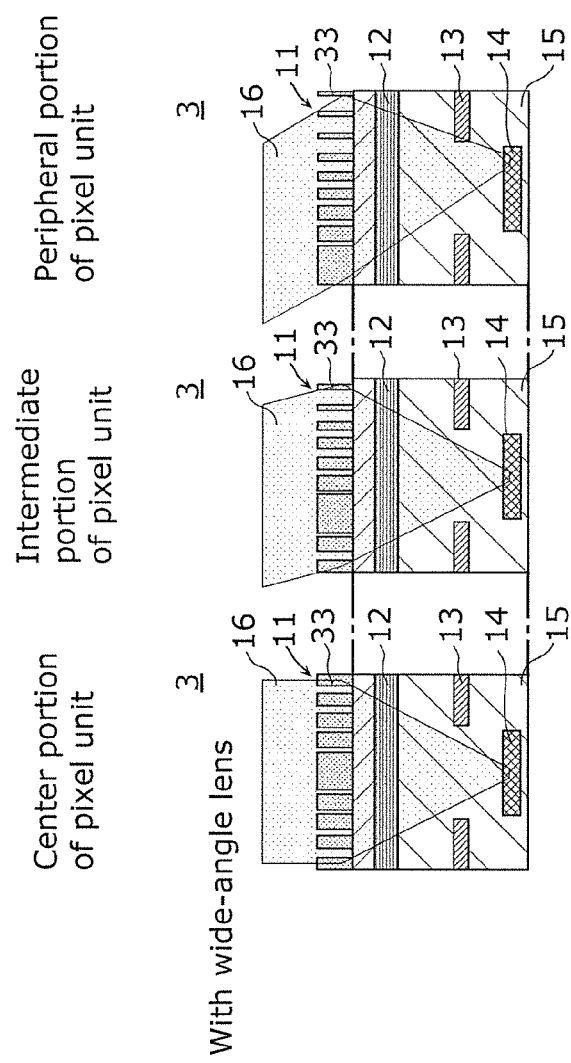

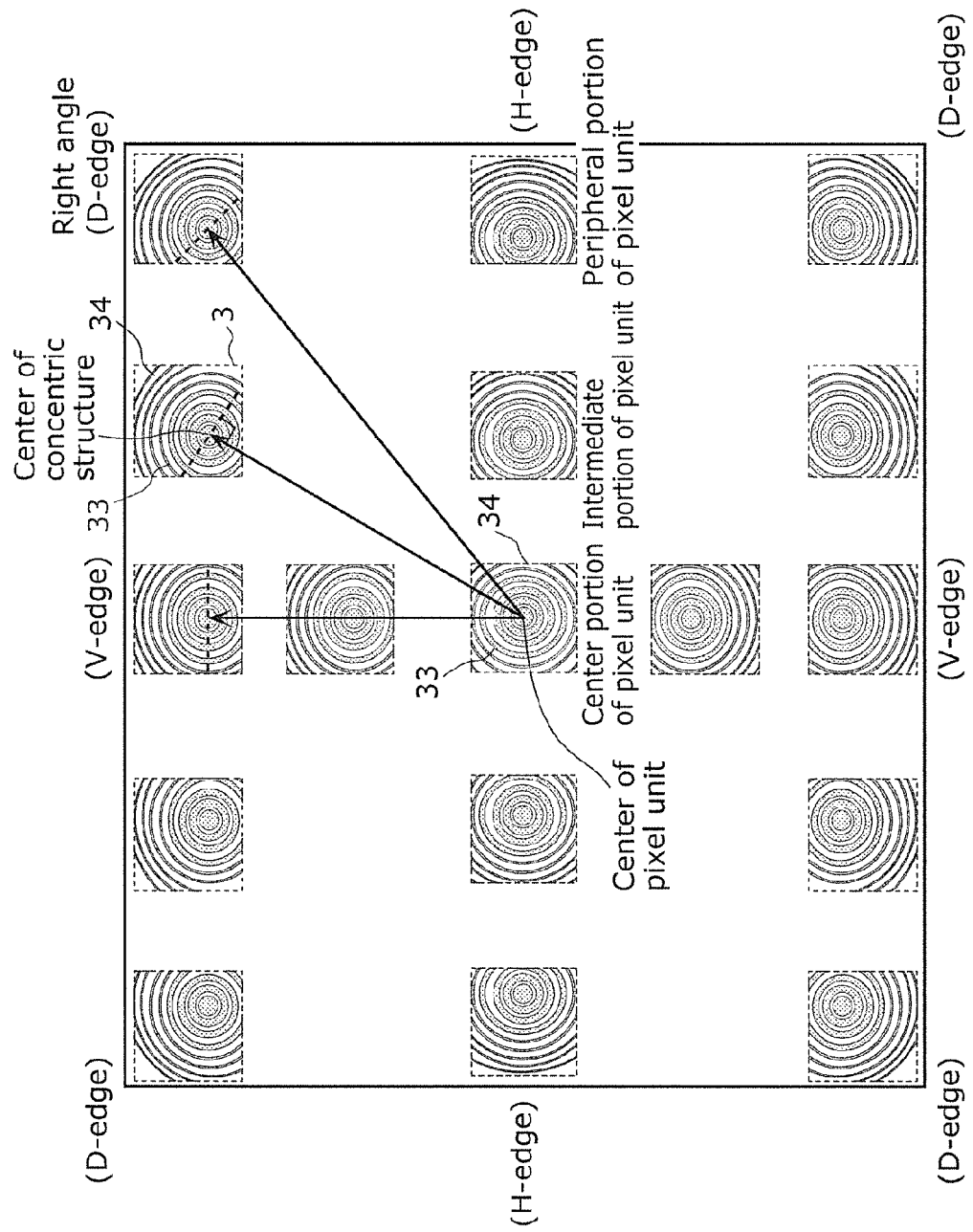

SOLID-STATE IMAGING DEVICE AND IMAGING APPARATUS

CROSS REFERENCE TO RELATED APPLICATION

This is a continuation application of PCT International Application No. PCT/JP2012/004131 filed on Jun. 26, 2012, designating the United States of America, which is based on and claims priority of Japanese Patent Application No. 2011-152279 filed on Jul. 8, 2011. The entire disclosures of the above-identified applications, including the specifications, drawings and claims are incorporated herein by reference in their entirety.

FIELD

The present disclosure relates to solid-state imaging devices for use in digital cameras and so on, and particularly relates to a solid-state imaging device for use in digital single-lens reflex cameras with interchangeable lenses.

BACKGROUND

In recent years, the market for solid-state imaging devices has expanded remarkably following the wide use of the digital cameras and mobile phones with cameras. Furthermore, digital single-lens reflex cameras have been available more and more in which a wide variety of optical lenses, from wide-angle lens to telephoto lens, are interchanged and used. Even in such a situation, the strong demand for thinner digital cameras still exists. Stated differently, this means that the focal length of a lens used for the camera module becomes shorter, and that light enters a solid-state imaging apparatus with a wide angle (that is, an angle obtained when measuring from a vertical axis of an incident surface of the solid-state imaging device is wider).

In solid-state imaging devices such as CCD image sensors or CMOS image sensors, an imaging region includes a plurality of semiconductor integrated circuits (unit pixels) having light-receiving elements arranged in a two-dimensional array, and converts a light signal from an object into an electric signal. The sensitivity of the solid-state imaging device is defined based on an amount of output current of a light-receiving element to an amount of incident light. Therefore, leading the incident light surely into the light-receiving element is an important factor for improving the sensitivity.

FIG. 10 shows an example of a basic structure of a common unit pixel 300 in the conventional technique.

The unit pixel 300 includes, as shown in FIG. 10, a microlens 305, a color filter 302, an Al wire 303, a signal transmission unit 304, a planarization layer 308, a light-receiving element 306, and a Si substrate 307. In this configuration, incident light 356 (light indicated by dashed lines) which enters vertically into the microlens 305 is separated into colors using one of red (R), green (G), and blue (B) color filters 302, and then converted into an electric signal at the light-receiving element 306. For its relatively high light-collection efficiency, microlenses having the above configuration are used in almost all solid-state imaging devices.

However, since the solid-state imaging device includes a plurality of unit pixels arranged in two-dimensional array as described above, the incident angle of light entering the unit pixels leans as the unit pixel is farther from the middle portion (center portion) toward the peripheral portion of the imaging region. As a result, a problem is caused that the light-collection efficiency of the unit pixels in the peripheral portion decreases as compared with that of the unit pixels at the middle portion. For example, when the light is received by the unit pixel 300 of the conventional technique shown in FIG. 10, the incident angle of the light entering the unit pixel 300 is smaller at the middle portion of the imaging region (as the incident light 356 indicated by dashed lines), whereby almost all of the light is collected by the light-receiving element 306 and become effective light. In contrast, in the peripheral portion of the imaging region, the incident angle of the light entering the unit pixel 300 is greater in the peripheral portion of the imaging region (as the incident light 357 indicated by the solid lines), which causes the incident light 357 to be intercepted by the Al wire 303 in the unit pixel 300 and unable to reach the light-receiving element 306. Therefore, the light-collection efficiency is reduced.

In view of this, as shown in FIG. 11, the Al wire 303 and the light-receiving element 306 are shifted (shrank) in an outward direction (toward the edge) in the imaging region of the unit pixel 300 in the peripheral portion of the imaging region, in an attempt to improve the light-collection efficiency of the incident light 357 having a great incident angle.

Alternatively, as another measure for solving the above decrease in collection efficiency, a solid-state imaging device has been proposed which realizes a gradient index lens having effective refractive index distribution with its fine structure smaller than or approximately the same as the wavelength of incident light (for example, see Patent Literature (PTL) 1). Specifically, at the center portion of the imaging region in the solid-state imaging device, a gradient index lens having an effective refractive index distribution symmetrical to the center of the unit pixel is formed with a combination of a plurality of zones which is in a concentric structure and divided into line width approximately the same or shorter than the wavelength of the incident light. Furthermore, in the peripheral portion of the imaging region of the solid-state imaging device, the gradient index lens having the effective refractive index distribution asymmetrical to the center of the unit pixel is formed with a combination of a plurality of zones which is in a concentric structure and divided into line width approximately the same or shorter than a wavelength of incident light, and the center of the concentric structure is shifted (offset) from the center of the unit pixel. With this configuration, even when the light incident on the peripheral portion of the solid-state imaging device enters obliquely with a great angle relative to a vertical axis of the incident surface (light-receiving surface), the incident light can be collected at the light-receiving element and the sensitivity in the peripheral portion of the solid-state imaging element can be equivalent to that obtained at the middle portion. As a result, when the incident angle of the principal light ray from the optical lens of the camera is constant, the sensitivity can be prevented from being decreased.

CITATION LIST

Patent Literature

[PTL 1] Japanese Unexamined Patent Application Publication No. 2006-351972

SUMMARY

Technical Problem

However, when the incident angle of the light from the optical lens is changed due to lens change for example, the light deviates from the light-receiving element in some cases.

For example, in the case where (i) the shrinkage amount of the wire and the light-receiving element or (ii) the offset amount at the center of the light-transmissive film in the concentric structure is designed to support the light of small incident angle incident when a telephoto lens is attached, when a wide-angle lens is attached, the sensitivity is lowered since the light with a large incident angle enters from the optical lens and part of the incident light deviates from the light-receiving element. In contrast, in the case where it is designed for an increased amount of shrinkage or offset to support incident light with a great incident angle, on the contrary, when the lens is replaced by a telephoto lens, the light with a small incident angle is incident and the sensitivity is decreased.

The present disclosure has been conceived in view of the above problem, and has an object to provide a solid-state imaging device and an imaging apparatus capable of suppressing the decrease of sensitivity even when the incident angle of the light entering the unit pixel is changed due to lens change or the like.

Solution to Problem

In order to solve the above problem, a solid-state imaging device according to an aspect of the present disclosure is a solid-state imaging device including: an imaging area; and unit pixels arranged in a two-dimensional array in the imaging area, the unit pixels each having a light-receiving element and a light-collecting element, wherein the light-collecting element includes: a plurality of light-transmissive films, which are divided into line widths shorter than or equal to a wavelength of light entering the light-receiving element, in a concentric structure about an axis which extends in a direction perpendicular to a light-receiving surface of the light-collecting element; and has an effective refractive index distribution controlled according to a combination of the light-transmissive films, the light-transmissive films include a first light-transmissive film which is closest to a center of the concentric structure having an outer edge in a shape of a true circle, and a second light-transmissive film different from the first light-transmissive film having an outer edge in a shape of an oval, on the light-receiving surface, a ratio of a long axis to a short axis of the oval of the outer edge increases as the second light-transmissive film is farther away from the center of the concentric structure, and a direction of the long axis of the oval of the second light-transimissive film is orthogonal to a vector which connects the center of the concentric structure and a center of the imaging area on the light-receiving surface.

In the effective refractive index distribution which is controlled according to a combination of the light-transmissive films in the concentric structure, the effective refractive index decreases in a continuous-function manner from its peak that is the position of the center of the concentric structure. With this, the shape of the concentric structure changes from a true circle to an oval as the concentric structure is farther from the center of the concentric structure. With this, the decrease ratio of the effective refractive index increases toward the short axis of the oval than toward the long direction of the oval. Specifically, the effective refractive index has a skewed distribution. In addition, the change in shape, that is from the true circle to the oval, is introduced gradually as the concentric structure is farther from the center of the concentric structure, and the oval region, in which the decrease ratio of the effective refractive index distribution increases, is limited to the periphery of the edge portion inside the unit pixel. By arranging the unit pixel including such a light-collecting element in the peripheral portion of the solid-state imaging device for example, the oblique incident light which have not been collected well and have deviated outside of the light-receiving element when the wide-angle lens is attached can be lead to the light-receiving element by being bent its travelling direction due to the advantageous effect brought by the increased effective refractive index decrease ratio in the periphery of the edge portion in the unit pixel. As a result, the light-collection efficiency improves. Furthermore, even when light having a small incident angle is incident when the telephoto lens is attached, the light is prevented from being bent too much and lead to the light-receiving element since the oval region is limited to the periphery of the edge portion of the unit pixel. Accordingly, incident light in a wide range from a low angle (narrow angle) to a wide angle can be collected without being lost, thereby suppressing the decrease in the sensitivity.

Furthermore, in the solid-state imaging device according to an aspect of the present disclosure, the unit pixels include a first unit pixel disposed at the center of the imaging area and a second unit pixel different from the first unit pixel, a center of a concentric structure of the first unit pixel matches a center of the first unit pixel, on the light-receiving surface, a center of a concentric structure of the second unit pixel is shifted from a center of the second unit pixel toward the center of the imaging area, on the light-receiving surface, and an amount of a shift between the center of the concentric structure of the second unit pixel and the center of the second unit pixel increases as the second unit pixel is farther away from the center of the imaging area.

With such a configuration, in the unit pixel at the center of the imaging area, the center of the concentric structure matches the center of the unit pixel, and the light-transmissive films are in a true-circle shape in most regions of the unit pixel. In the unit pixel at the center of the imaging area, the incident angle of the light is constantly parallel to the direction perpendicular to the imaging surface (light-receiving surface) regardless of whether the camera lens is of wide-angle or telephoto. Therefore, the incident light is collected to the light-receiving element by the light-collecting element including light-transmissive films in a true circle. In contrast, the center of the concentric structure is offset toward a direction extending to the center of the imaging area as the concentric structure is closer to the peripheral portion of the imaging area. Therefore, the unit pixels in the peripheral portion of the imaging area includes larger oval region, in which the effective refractive index decrease ratio is increased, in the region farther from the center of the imaging area. Therefore, the oblique incident light, which have not been collected well and have deviated outside of the light-receiving element when the wide-angle lens is attached, can be lead to the light-receiving element by being bent its travelling direction due to the advantageous effect brought by the increased effective refractive index decrease ratio in the periphery of the edge portion of the unit pixel. As a result, the light-collection efficiency improves.

Furthermore, in the solid-state imaging device according to an aspect of the present disclosure, in the effective refractive index distribution on the light-receiving surface of the light-collecting element, an effective refractive index may peak at the center of the concentric structure and decrease according to a distance from the center of the concentric structure in a parabolic manner, and the effective refractive index distribution in a short-axis direction of the oval on the light-receiving surface of the light-collecting element may have a skewed distribution in which the effective refractive index decreases with the fourth power of the distance from the center of the concentric structure.

With this configuration, in each of the unit pixels in the solid-state imaging device, the position of the center of the concentric structure is offset from the center of the unit pixel and placed closer to the center of the solid-state imaging device. Thus, the region with the increased effective refractive index decrease ratio gets larger only at the edge of the pixel array in the unit pixels as the unit pixel is closer to the peripheral portion from the center of the solid-state imaging device. Accordingly, the light having a great incident angle can be collected, and the light having a small incident angle can be also collected without being lost since the region with the increased effective refractive index decrease ratio in the unit pixel is present only at the edge of the pixel array.

Furthermore, in the solid-state imaging device according to an aspect of the present disclosure, the light-collecting element may form an inner-layer lens.

With this configuration, the two lenses can be combined by placing the inner-layer lens having the above-described effective refractive index distribution and by placing the microlens on the top face of the device, thereby farther expanding the incident angle margin of the incident light.

Furthermore, an imaging apparatus according to an aspect of the present disclosure includes the above-described solid-state imaging device.

With this configuration, the decrease of sensitivity can be suppressed even when the incident angle of the light entering the unit pixel is changed due to lens change or the like.

Advantageous Effects

With the solid-state imaging device according to the present disclosure, it is possible to prevent an image from being dark which is obtained in the peripheral portion of the solid-state imaging device at a time of capturing, even when the incident angle of the light entering the unit pixel is changed significantly from a wide angle to a low angle due to lens change or the like. Therefore, even when an imaging lens of a single-lens reflex camera, in which various lenses from wide-angle to telephoto are used interchangeably, is applied for digital cameras or the like, a light image can be obtained in the peripheral portion of the solid-state imaging device.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3B shows an example of top view of light-collecting elements of unit pixels in different portions on the imaging surface of the solid-state imaging device according to Embodiment 1.

FIG. 4A shows an outline of light collection performed by the light-collecting elements on light entering different portions on the imaging surface, when a wide-angle lens is attached as a lens for a single-lens reflex camera provided with the solid-state imaging device according to Embodiment 1.

FIG. 5 shows an example of a top view of light-collecting elements of unit pixels in different portions on the imaging surface of the solid-state imaging device according to Embodiment 1.

DESCRIPTION OF EMBODIMENTS

Figure 1:
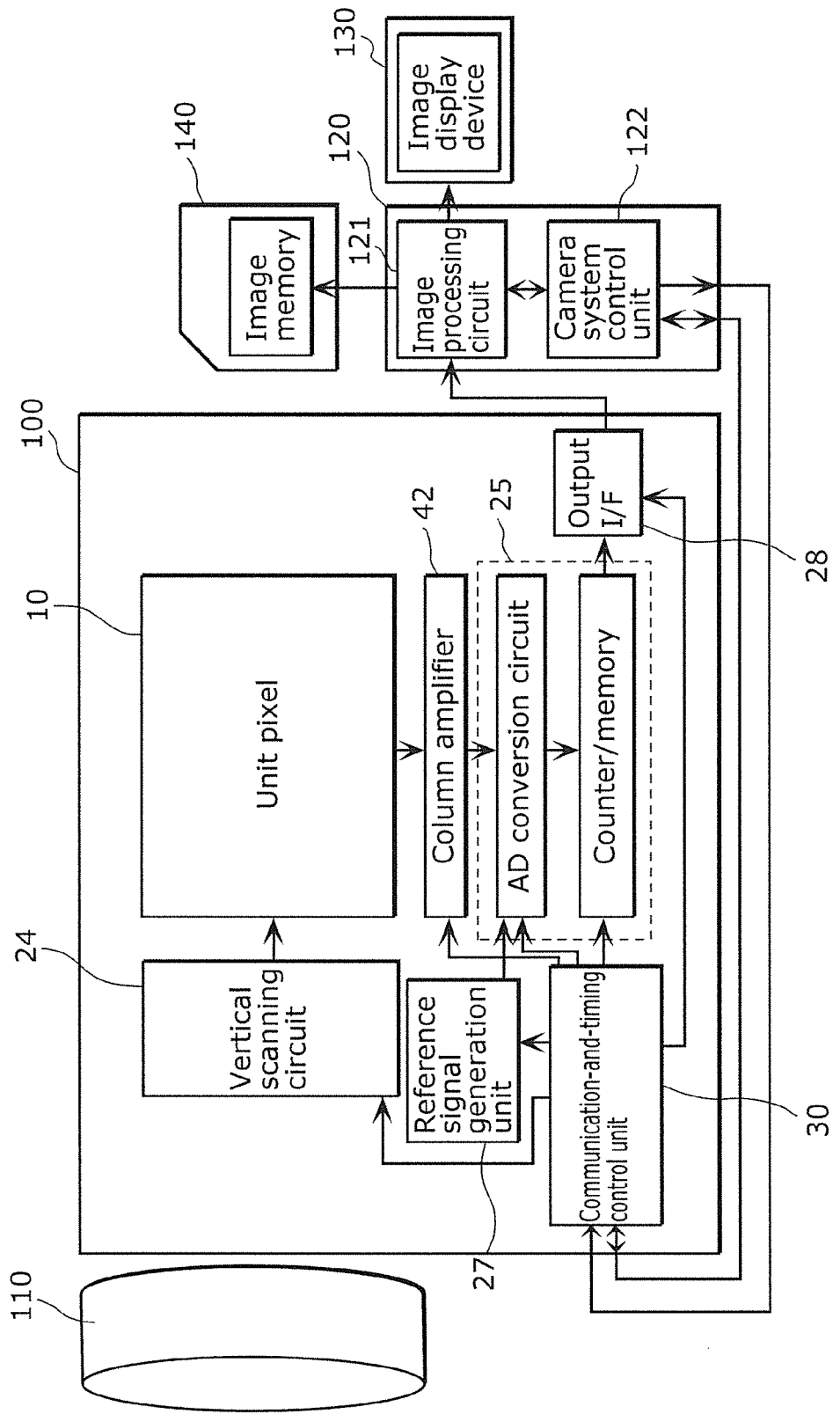
FIG. 1 shows a schematic configuration of an imaging apparatus (camera) according to Embodiment 1.

The following describes further details of a solid-state imaging device according to embodiments with reference to the Drawings. Although the following description is based on the embodiments below and the drawings attached, the embodiments and the drawings are given for illustrative purpose only and are not intended to limit the scope of the present inventive concept. Specifically, the numerical values, shapes, constituent elements, the arrangement and connection of the constituent elements, timing, the order of timing etc. shown in the following embodiments are mere examples, and thus do not limit the present disclosure. The present disclosure is limited only by Claims. Thus, among the constituent elements in the following exemplary embodiments, constituent elements not recited in any of the independent claims indicating the most generic concept of the present disclosure are not always required to achieve the aim of the present disclosure, but are described as preferable constituent elements. Furthermore, in the Drawings, the elements representing substantially the same structure, operation and effect are given the same reference numerals.

Embodiment 1

Figure 2:
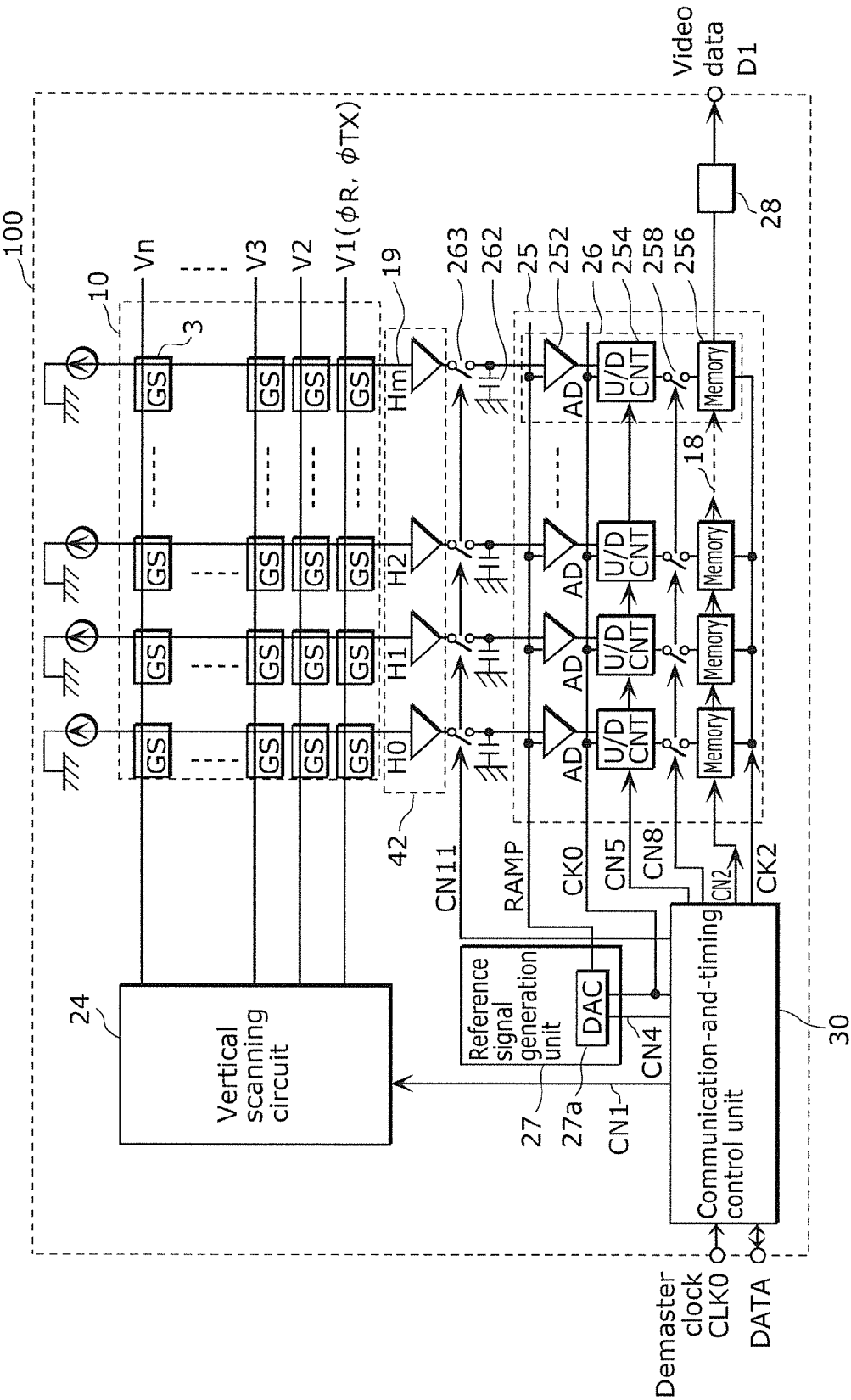
FIG. 2 shows a detailed configuration of a solid-state imaging apparatus according to Embodiment 1.

FIG. 1 shows a schematic configuration of an imaging apparatus (camera) according to Embodiment 1. FIG. 2 shows a detailed configuration of a solid-state imaging apparatus 100 according to the present embodiment.

This camera includes a solid-state imaging apparatus 100, a lens 110, a digital signal processing circuit (DSP) 120, an image display device 130, and an image memory 140.

In a digital single-lens reflex camera, the lens 110 is an interchangeable lens and is replaced by optical lenses having different focal lengths. Specifically, the lens 110 is: an imaging lens for wide-angle incident light and a telephoto lens; or an imaging lens which supports a case where light enters telecentrically (in a manner that an optical axis and a principal light ray are substantially parallel) into the solid-state imaging apparatus 100.

With this camera, the light enters from outside via the lens 110, and the incident light is converted into a digital signal and output by the solid-state imaging apparatus 100. Then, the output digital signal is processed by the DSP 120 and is output as a video signal to and recorded in the image memory 140, and is output and displayed as an image by the image display device 130.

The DSP 120 includes: an image processing circuit 121 which generates a video signal by performing processing such as noise removal on the output signal of the solid-state imaging apparatus 100; and a camera system control unit 122 which controls scanning timing and gain of the unit pixels (unit cells) 3 in the solid-state imaging apparatus 100. The DSP 120 corrects differences in features between the pixels (photoelectric conversion elements) shared in the unit pixels 3 in the solid-state imaging apparatus 100, for example.

The solid-state imaging apparatus 100 is formed of a single chip, and the chip on which the solid-state imaging apparatus 100 is formed and the chip on which the DSP 120 is formed are different chips. With this, the process for forming the solid-state imaging apparatus 100 and the process for forming the DSP 120 can be separated and thus the processes for manufacturing the imaging unit and the processing unit can be separated, thereby reducing the manufacturing processes and the costs. Furthermore, each user is allowed to set timing control, gain control, and image processing freely, thereby improving the flexibility in usage.

The solid-state imaging apparatus 100 is a CMOS solid-state imaging apparatus, and includes: a pixel unit (pixel array) 10 as an imaging region: a vertical scanning circuit (row scanning circuit) 24; a communication-and-timing control unit 30; an analog/digital (AD) conversion circuit 25; a reference signal generation unit 27; an output I/F 28; a signal holding switch 263; a signal holding capacitor 262; and a column amplifier 42.

The pixel unit 10 includes: a plurality of unit pixels 3 arranged two-dimensionally (in rows and columns) on a well of a semiconductor substrate; and a vertical signal line 19 provided for a column of the unit pixels 3. Each of the unit pixels 3 includes pixel elements such as a photodiode and a transistor. The unit pixel 3 is connected to: a signal line controlled by the vertical scanning circuit 24; and the vertical signal line 19 which transmits a voltage signal from the corresponding unit pixel 3 to the AD conversion unit 25. The pixel unit 10 is an example of the solid-state imaging device.

The vertical scanning circuit 24 scans the unit pixels 3 in a vertical direction on a row-by-row basis, and selects a row of unit pixels 3 with the vertical signal line 19 from which the voltage signal is output.

The communication-and-timing control unit 30 receives master clock CLK0 and DATA input via an external terminal, generates various internal clock based on the received CLK0 and DATA, and controls the reference signal generation unit 27 and the vertical scanning circuit 24.

The reference signal generation unit 27 includes a digital/analog converter (DAC) 27a, which supplies a reference voltage RAMP for AD conversion to a column analog/digital converter (column AD) circuit 26 of the AD conversion circuit 25.

The column amplifier 42, the signal holding switch 263, and the signal holding capacitor 262 are provided for each column of the unit pixels 3. The column amplifier 42 amplifies the voltage signal output from the corresponding unit pixels 3, and the signal holding capacitor 262 holds the amplified voltage signal transmitted via the signal holding switch 263. Providing the column amplifier 42 allows amplifying the voltage signal of the unit pixels 3, thereby improving signal/noise (S/N) and switching gain.

The AD conversion circuit 25 includes a plurality of column AD circuits 26 each provided for a column of the unit pixels 3. The column AD circuit 26 converts the analog voltage signal of the signal holding capacitor 262 output from the unit pixels 3 into a digital signal, using the reference voltage RAMP generated by the DAC 27a.

The column AD circuit 26 includes a voltage comparison unit 252, a counter unit 254, a switch 258, and a data storage unit 256. The voltage comparison unit 252 compares, with the reference voltage RAMP, the analog voltage signal obtained from the unit pixels 3 via the vertical signal line 19 (H0, H1, . . . ) and the signal holding capacitor 262. The data storage unit 256 is configured as a memory which holds time taken until the voltage comparison unit 252 completes the comparison processing and the result of counting performed using the counter unit 254.

The voltage comparison unit 252 has one input terminal which receives, together with the input terminals of other voltage comparison units 252, the reference voltage RAMP in stages generated by the DAC 27a. The other input terminal of the voltage comparison unit 252 is connected to the signal holding capacitor 262 of the corresponding one of the columns, and receives the voltage signal from the pixel unit 10. The output signal of the voltage comparison unit 252 is supplied to the counter unit 254.

The column AD circuit 26 starts counting using the clock signal at the same time when the reference voltage RAMP is supplied to the voltage comparison unit 252, and performs AD conversion by counting until a pulse signal is obtained by comparing the analog voltage signal input via the signal holding capacitor 262 with the reference voltage RAMP.

At this time, the column AD circuit 26 performs, together with the AD conversion, processing for taking a differential between (i) the signal level (noise level) immediately after the unit pixels are reset (initialized) and (ii) a true signal level Vsig (according to received light amount), on the pixel signal (voltage signal) of a voltage mode input via the signal holding capacitor 262. Accordingly, noise signal components called fixed pattern noise (FPN), reset noise, and the like, can be removed from the voltage signal.

The column AD circuit 26 extracts only the true signal level Vsig by down counting the noise level and up counting the signal level. The signal digitized by the column AD circuit 26 is input to the output I/F 28 via the horizontal signal line 18.

Although the solid-state imaging apparatus 100 shown in FIG. 1 and FIG. 2 is provided with the AD conversion circuit 25, the AD conversion circuit 25 may be provided outside the solid-state imaging device 100.

With the above configuration, in the solid-state imaging apparatus 100, the pixel unit 10 sequentially outputs the voltage signal from each row of the unit pixels 3. Furthermore, a frame image that is an image of one sheet for the pixel unit 10 is shown by a group of voltage signals of the entire pixel unit 10.

Figure 3A:
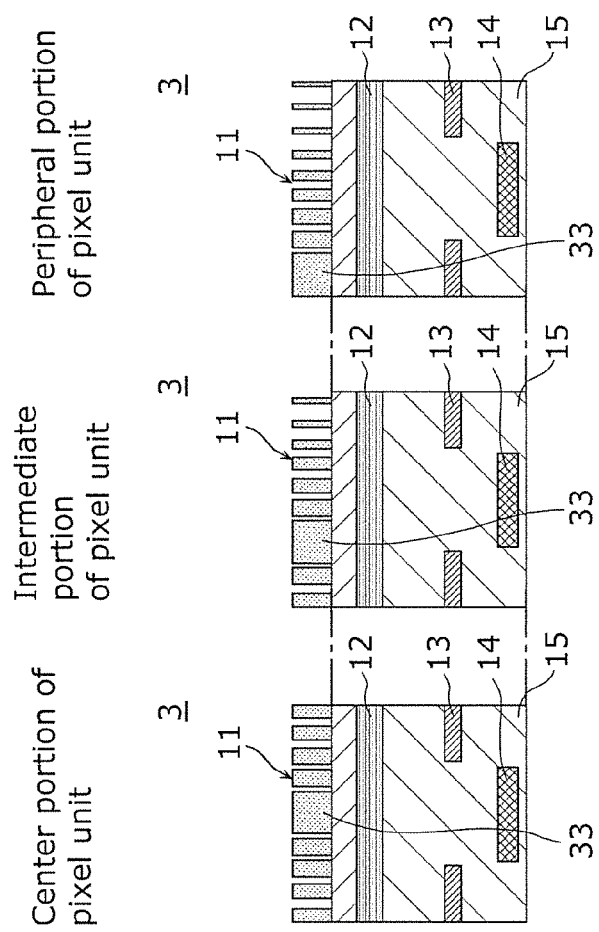
FIG. 3A shows a sectional view of an example of structures of unit pixels in different portions of an imaging surface of the solid-state imaging device according to Embodiment 1.

FIG. 3A and FIG. 3B each shows an example of a basic structure of the unit pixel 3 in the pixel unit 10 as the solid-state imaging device according to Embodiment 1.

Figure 3C:
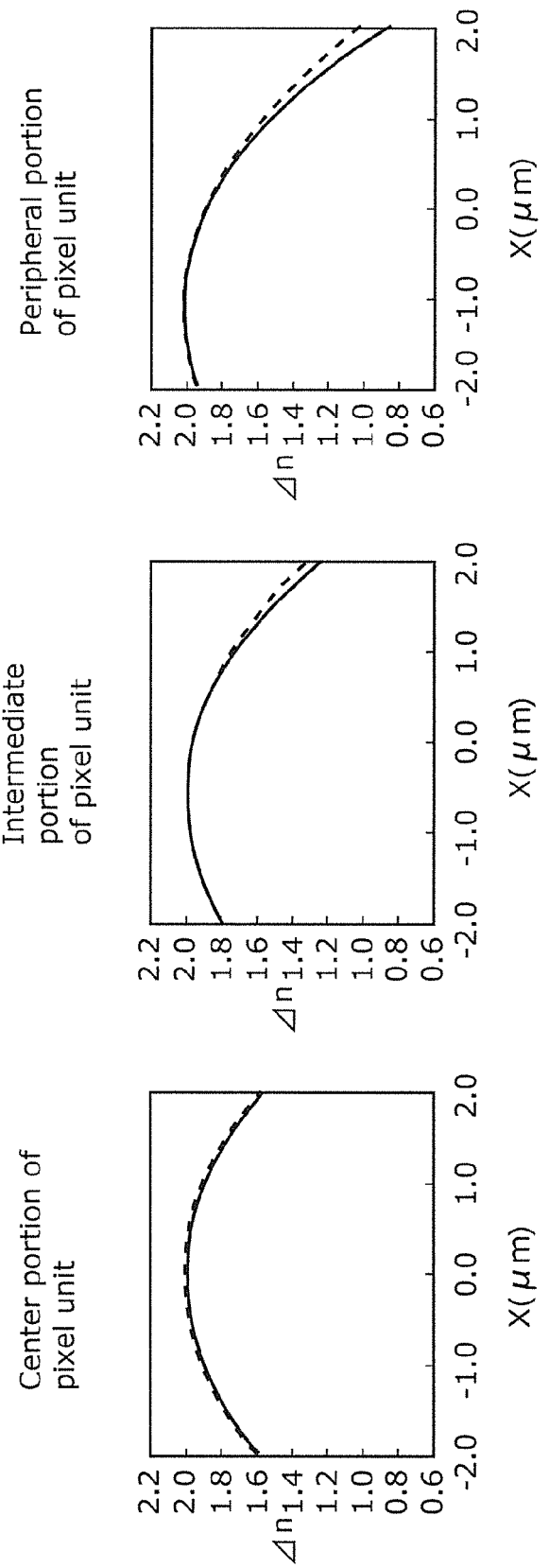
FIG. 3C shows an example of graph of effective refractive index distribution of light-collecting elements of unit pixels in different portions on the imaging surface of the solid-state imaging device according to Embodiment 1.

It is to be noted that FIG. 3A and FIG. 3B show the structure and FIG. 3C shows effective refractive index distribution, of the unit pixels 3 in different portions in a horizontal direction (row direction) on the imaging surface (light-receiving surface) of the solid-state imaging device. Specifically, (i) the structure and effective refractive index distribution of the unit pixels 3 in the middle portion (center portion) of the pixel unit 10 are shown in the left side, (ii) those in the intermediate portion of the middle portion and the peripheral portion of the pixel unit 10 are shown in the center, and (iii) those in the peripheral portion of the pixel unit 10 are shown in the right side, of FIG. 3A to FIG. 3C. Furthermore, FIG. 3A shows a sectional view of the unit pixels 3, FIG. 3B shows a top view (view on imaging surface) of the unit pixels 3 (light-collecting elements 11), and FIG. 3C shows the effective refractive index distribution of the light-collecting elements 11.

As shown in FIG. 3A to FIG. 3C, the solid-state imaging device is a pixel unit 10 in which the unit pixels 3 each having the light-receiving element 14 and the light-collecting element 11 are arranged tow-dimensionally, wherein the light-collecting element 11: includes a plurality of light-transmissive films 33, which are divided into line widths 35 which are as long as shorter than or equal to a wavelength of light entering the light-receiving element 14, that is, divided into the line widths 35 which are shorter than or equal to the wavelength of light entering the light-receiving element 14, in a concentric structure about an axis which extends in a direction perpendicular to a light-receiving surface of the light-collecting element 11; and has an effective refractive index distribution controlled according to a combination of the light-transmissive films 33, among the light-transmissive films 33 in the concentric structure, a light-transmissive film 33 which is closest to a center of the concentric structure has an outer edge (inner edge) in a shape of a true circle, and a light-transmissive film 33 far from the center of the concentric structure has an outer edge in a shape of an oval, on the light-receiving surface (when viewing from a direction vertical to the light-receiving surface), a ratio of a long axis to a short axis of the oval of the outer edge increases as the light-transmissive film 33 is farther away from the center of the concentric structure, and a direction of the long axis of the oval in each of the unit pixels 3 is orthogonal to a vector which connects the center of the concentric structure of each of the unit pixels 3 and a center of the pixel unit 10 on the light-receiving surface.

As shown in FIG. 3A, in any of the middle portion, the intermediate portion, and the peripheral portion of the pixel unit 10, the unit pixels 3 each includes the light-collecting element 11 that is the distribution gradient index lens, the color filter 12, the wire 13 such as Al wire, the light-receiving element 14 such as a Si photodiode etc., and the semiconductor substrate 15. Furthermore, the film thickness of the light-collecting element 11 is 1.2 [μm], for example. As shown in FIG. 3B, the size of each of the plurality of unit pixels 3 (area in light-receiving surface) is equal which can be 3.75 [μm]× 3.75 [μm], for example. Although each of the unit pixels 3 in the middle portion, intermediate portion, and peripheral portion of the pixel unit 10 has the same size, constituent elements, and position, only the structures of the light-collecting elements 11 are different.

As shown in FIG. 3B, the light-collecting element 11 in each of the unit pixels 3 includes a light-transmissive film 33 formed of $SiO_2$ (n=1.45) and air 34 (n=1.0), for example. The light-transmissive film has a concentric structure on the light-receiving surface. Accordingly, in the concentric structure on the light-receiving surface, the light-transmissive film 33 in a true circle shape is placed first at the center, the light-transmissive film 33 in a ring shape (circular shape) is placed to surround the true-circle shaped light-transmissive film 33, and another light-transmissive film 33 in a ring shape is further placed to surround the ring-shaped light-transmissive film 33. Although the plurality of ring-shaped light-transmissive films 33 each has a different outer diameter in the concentric structure on the light-receiving surface, the center of the plurality of ring-shaped light-transmissive film 33 matches the center of the true-circle-shaped light-transmissive film 33 at the center. Specifically, the center of the true-circle-shaped light-transmissive film 33 is the center of the concentric structure. In the concentric structure on the light-receiving surface, the difference in the radius of inner circles of neighboring light-transmissive films 33 (difference in the longer diameters or the inner diameters of the ovals of the light-transmissive film 33) increases as the distance of the light-transmissive films 33 from the center of the concentric structure increases, and the difference varies in a range from approximately 100 [μm] to approximately 200 [μm].

Here, a region obtained by dividing the light-collecting element 11 on the light-receiving surface into donut shapes having a width of a line width (the difference in the radius of inner circles) 35 is referred to as a zone. The line width of the light-transmissive film 33 on the light-receiving surface is the greatest at the center of the concentric structure, and decreases as the ring-shaped light-transmissive film 33 is farther from the center of the concentric structure. In this case, when the width of the zone is substantially the same as or smaller than the wavelength of the incident light, the effective refractive index to the incident light can be calculated by a volume ratio of the $SiO_2$ that is the light-transmissive film 33 (refractive index n=1.45) and the air 34 (refractive index n=1.0). As described above, the solid-state imaging device shown in FIG. 3A to FIG. 3C has a feature that the effective refractive index distribution can be controlled freely by simply changing the line width of the light-transmissive film 33, that is, the volume ratio of the light-transmissive film and the air.

On the light-receiving surface, the position of the center of the concentric structure (position of an intersection point of the dashed lines in FIG. 3B) is offset as it is closer to the peripheral portion from the middle portion of the pixel unit 10. Accordingly, (i) the center of the concentric structure in the unit pixel 3 in the center portion of the pixel unit 10 matches the center of the unit pixel 3 on the light-receiving surface, and (ii) the center of the concentric structure in the unit pixel 3 far from the center portion of the pixel unit 10 is shifted from the center of the unit pixel 3 toward the center of the pixel unit 10 on the light-receiving surface, and the shift amount is greater in the unit pixel 3 farther away from the center portion of the pixel unit 10. In this way, on the light-receiving surface, the region (number) of the ovals of the light-transmissive film 33 included in a single unit pixel 3 increases in the edge-side of the array (peripheral-portion side of the pixel unit 10) of the light-transmissive film 33 in the unit pixel 3, as it is farther from the middle portion toward the peripheral portion. Therefore, even when the incident angle of the light from the camera lens is great in the peripheral portion of the pixel unit 10, such as when the wide-angle lens is attached, the light can be lead to the light-receiving element 14 by the oval region. On the other hand, since the oval region of the light-transmissive film 33 increases only in the edge-side of the array of the light-transmissive film 33 in the unit pixel 3 on the light-receiving surface, even when the incident angle of the light from the camera lens is small, such as when the telephoto lens is attached, the light can be received without being lost since the light is collected in the region having a structure close to the true circle at the middle side of the array (middle-portion side of the pixel unit 10) of the light-transmissive film 33 in the unit pixel 3.

The solid line in FIG. 3C shows the effective refractive index distribution of the solid-state imaging device according to the present embodiment, and the effective refractive index distribution is represented by Equation (1) below.

$$\Delta n(x,y) = \Delta n_{max}[(A(x^2+y^2)+Bx\sin\theta/2\pi+C]+G(x) \quad (1)$$

Here, A, B, and C are constants, and x and y represent two-dimensional coordinates having the origin at the center of the unit pixel 3. Particularly, FIG. 3C shows a result of plotting of the effective refractive index distribution where y=0. θ is a lens design angle (optimal lens design angle for light entering at an angle θ), and is different from the incident angle of the actual light (the light actually entering the lens includes light having an incident angle other than the angle θ). $\Delta n_{max}$ represents the difference in the refractive index between the light-transmissive film 33 and the air, and an example of the refractive index difference between the $SiO_2$ as the light-transmissive film 33 and the air is 0.45. Constants A and B can be represented by Equations (1-1) to (1-3) below, when (i) the refractive index of the medium of the side, from which the light is incident, of the side of the light-collecting element 11, is represented as $n_0$, (ii) the refractive index of the medium of the side, into which the light is output, of the light-collecting element 11 is represented as $n_1$, (iii) the focal length is represented as f, and (iv) the wavelength of the light entering the light-collecting element 11 is represented as λ.

$$A=-(k_0 n_1)/2f \quad (1-1)$$

$$B=-k_0 n_0 \quad (1-2)$$

$$K_0=2\pi/\lambda \quad (1-3)$$

With this, the light-collecting element 11 can be optimized depending on (i) an intended focal length and (ii) an incident angle and a wavelength of the targeted incident light. In Equation (1) above, the light collecting component is represented by a quadratic function of the distance x from the center of the unit pixel 3, and the deflection component is represented by the product of the distance x and the trigonometric function.

Function G(x) in Equation (1) above is a quartic function of x represented by Equation (1-4) below, and contributes to the change in the shape of the light-transmissive film 33 continuously from a true circle to an oval as it is farther from the center of the concentric structure of the light-transmissive film 33. Therefore, the effective refractive index distribution on the light-receiving surface of the light-collecting element 11 has an effective refractive index which peaks at the center of the concentric structure and decreases according to a distance from the center of the concentric structure in a parabolic manner, and the effective refractive index distribution in a short-axis direction of the oval on the light-receiving surface of the light-collecting element 11 has a skewed distribution in which the effective refractive index decreases with the fourth power of the distance from the center of the concentric structure.

$$G(x)=-D(x-x_0)^4 \quad (1-4)$$

Here, $x_0$ represents an x-coordinate component at the center of the concentric structure. It is to be noted that a y-coordinate component at the center of the concentric structure is 0. D is a parameter for controlling the magnitude of change in shape, and D=0.001 in FIG. 3C. It is to be noted that the effective refractive index distribution where D=0 is indicated by the dashed line for comparison. In this case, all of the light-transmissive films 33 in the concentric structure are in the true circle, which correspond to the conventional lens structure.

Figure 4B:
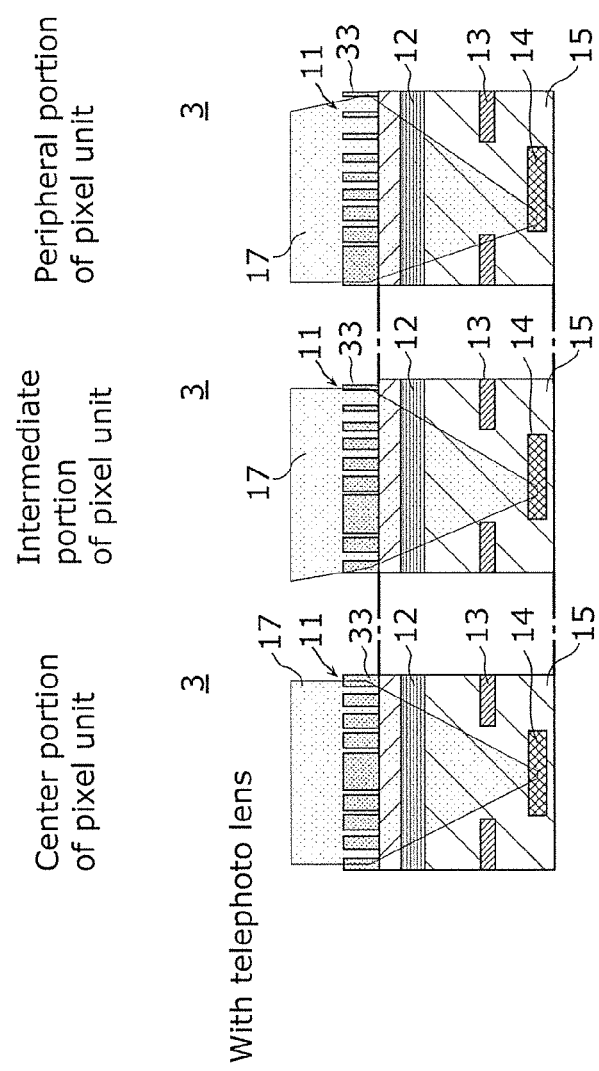
FIG. 4B shows an outline of light collection performed by the light-collecting elements on light entering different portions on the imaging surface, when a telephoto lens is attached as a lens for a single-lens reflex camera provided with the solid-state imaging device according to Embodiment 1.

FIG. 4A and FIG. 4B show schematic views showing how to collect incident light, when a wide-angle lens or a telephoto lens is used, respectively, as the lens 110 for a single-lens reflex camera equipped with the solid-state imaging device according to the present embodiment.

It is to be noted that FIG. 4A and FIG. 4B show the sectional view of the unit pixels 3 in different portions in a horizontal direction (row direction) on the imaging surface (light-receiving surface) of the solid-state imaging device. Specifically, (i) the middle portion of the pixel unit 10 is shown in the left side, (ii) the intermediate portion between the middle portion and the peripheral portion of the pixel unit 10 is shown in the center, and (iii) the peripheral portion of the pixel unit 10 is shown in the right side, of FIG. 4A and FIG. 4B. Furthermore, FIG. 4A shows how to collect the incident light 16 when the wide-angle lens is attached, and FIG. 4B shows how to collect the incident light 17 when the telephoto lens is attached.

As shown in FIG. 4A, when the wide-angle camera is attached, the incident light 16 having a large angle enters the unit pixel 3 positioned at the peripheral portion in the pixel unit 10. With the solid-state imaging device according to the present embodiment, since the light-collecting element 11 has an increased effective refractive index distribution in the edge-side of the array of the light-transmissive film 33 in the unit pixel 3, the incident light 16 having a large angle connects the focal point at an edge-side position in the unit pixel 10 on the light-receiving element 14 and is collected.

On the other hand, as shown in FIG. 4B, when the telephoto lens is attached, the incident light 17 having a small angle enters the unit pixel 3 positioned at the peripheral portion in the pixel unit 10. In the solid-state imaging device according to the present embodiment, the light-collecting element 11 has the great effective refractive index distribution only in the edge-side of the array in the unit pixel 3. Therefore, even when the incident light 17 having a small angle enters, the incident light 17 is prevented from being bent too much, connects the focal point at a middle-portion side position of the unit pixel 10 on the light-receiving element 14, and is collected.

As described above, it is possible to collect the incident light to the light-receiving element 14 without being lost, even when the light entering the unit pixel 3 from the lens 110 of the camera changes significantly from a wide angle to a low angle.

Figure 6:
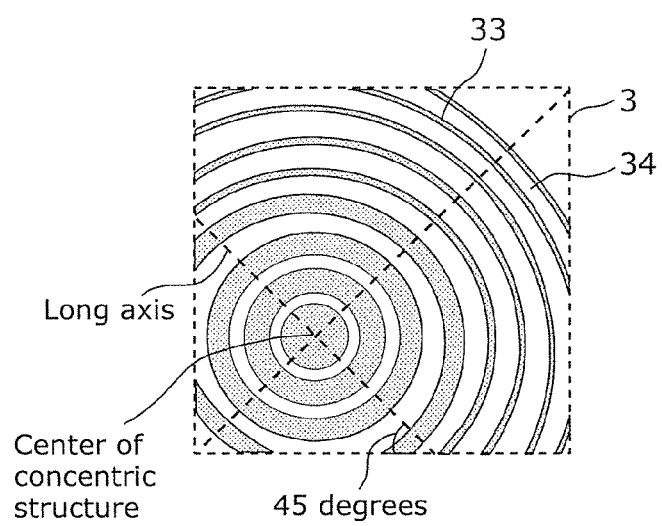
FIG. 6 shows an example of a top view of a light-collecting element of unit pixels at corners of the image (D-edge) which are four corners of the solid-state imaging device according to Embodiment 1.

FIG. 5 shows a top view of the light-collecting element 11 of each unit pixel 3 arranged on the imaging surface of the solid-state imaging device according to the present embodiment. Furthermore, FIG. 6 shows a top view of the light-collecting element 11 of the unit pixel 3 in the region at corners of the image (D-edges) which are four corners in FIG. 5.

The solid-state imaging device according to the present embodiment has a structure in which the direction of the long axis (dashed lines in FIG. 5) of the oval of the light-transmissive film 33 in each unit pixel 3 is, on the light-receiving surface, orthogonal to a vector connecting (i) the center of the concentric structure of the light-transmissive film 33 in each unit pixel 3 and (ii) the center of the pixel unit 10 of the solid-state imaging device, to realize the above-described light collection effect in the entire pixel unit 10. This structure can be realized by rotating the long-axis direction of the oval according to a ratio of the number of pixels in the vertical direction and the number of pixels in the horizontal direction (also referred to as aspect ratio) of the solid-state imaging device. For example, in the region at D-edge, the ratio of the number of pixels in the vertical direction and the number of pixels in the horizontal direction is 1:1, and the long-axis direction is rotated by 45 degrees. With such a structure, the same light collection effect can be realized at all of the H-edges, V-edges, and D-edges, of the pixel unit 10.

Figure 7:
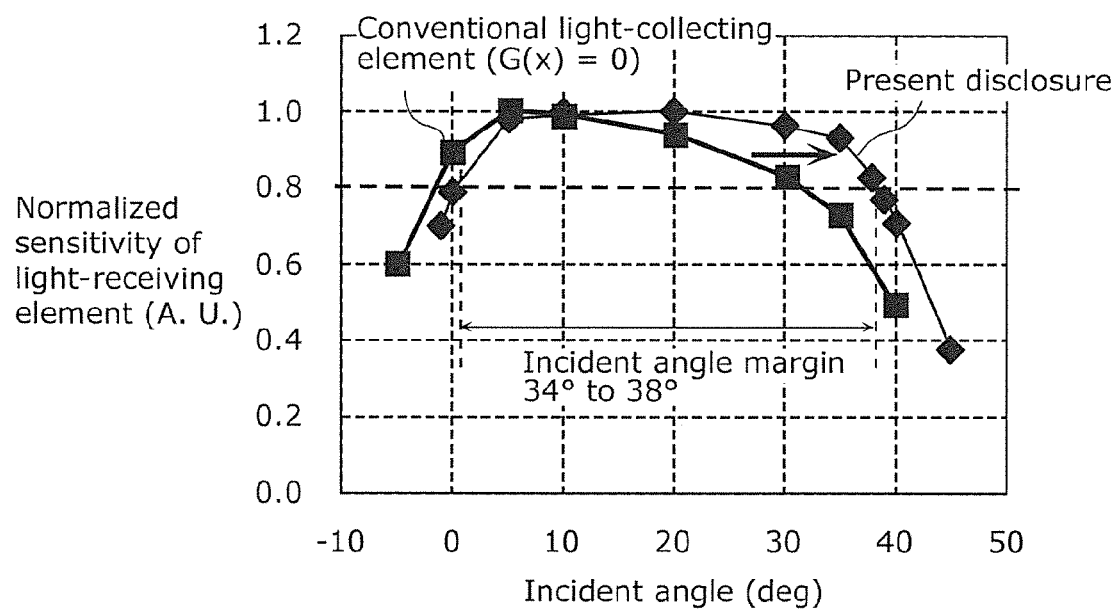
FIG. 7 shows incident angle dependency of light-receiving sensitivity of the light-receiving elements in the solid-state imaging device according to Embodiment 1.

FIG. 7 shows a graph showing the incident angle dependency of the light-receiving sensitivity of the light-receiving element 14 (normalized sensitivity of the light-receiving element 14) in the solid-state imaging device according to the present embodiment.

As shown in FIG. 7, the light-collecting element 11 indicated by "black diamonds" can collect the incident light having incident angle of a wide range, that is from 0° to approximately 40°, with high efficiency (80% or more). It can be understood that the incident angle margin is increased remarkably as compared with the conventional light-collecting element indicated by "black squares" (structure with G(x) =0 in Equation (1-4)), which means a wider angle is supported.

As described above, in the solid-state imaging device according to the present embodiment, the shape of the concentric structure of the light-collecting element 11 changes, on the light-receiving surface, from a true circle to an oval as it is farther from the center of the concentric structure. Furthermore, the oval region of the unit pixel 3 in the peripheral portion in the pixel unit 10 is greater in the edge side of the array than that of the unit pixel 3 in the center portion. Accordingly, oblique incident light entering when the wide-angle lens is attached can be bent greatly according to the great decrease ratio in the effective refractive index in the periphery of the edge portion of the unit pixel 3, and lead to the light-receiving element. At this time, the light having a small incident angle entering when the telephoto lens is attached is not bent greatly, since the oval region is limited to the periphery of the edge portion of the unit pixel. As a result, the decrease of sensitivity can be suppressed even when the incident angle of the light entering the unit pixel is changed due to lens change or the like.

Embodiment 2

A solid-state imaging device according to Embodiment 2 is different from the solid-state imaging device according to Embodiment 1 in that: the light-collecting element 11 forms an inner-layer lens; and the light-collecting element 11 which is a combination of a plurality of light-transmissive films in a concentric structure is placed as the inner-layer lens. Furthermore, it is also different from Embodiment 1 in that the microlens is provided at an upper layer of the color filter 12. The following describes the solid-state imaging device according to the present embodiment with focusing on the differences from Embodiment 1, with reference to FIG. 8 and FIG. 9.

Figure 8:
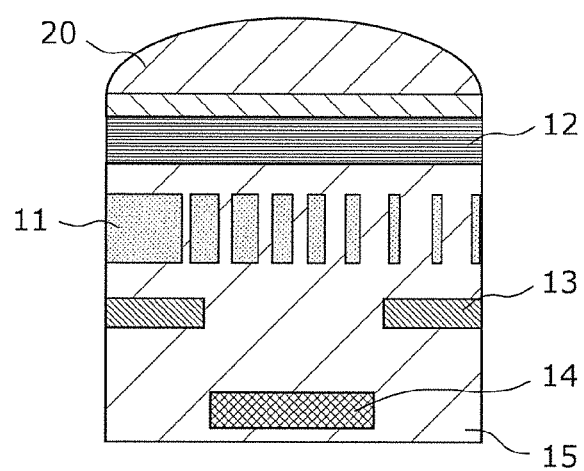
FIG. 8 shows a sectional view of a unit pixel in a solid-state imaging device according to Embodiment 2.

FIG. 8 shows a sectional view of a unit pixel 3 in the solid-state imaging device according to the present embodiment.

In this unit pixel 3, the light-collecting element 11 is provided at a lower layer of the color filter 12, and the microlens 20 is provided at the upper layer of the color filter 12. Combining two lenses in this manner by using the light-collecting element 11 having the effective refractive index distribution shown in FIG. 3C as the inner-layer lens and providing the microlens 20 on the top face of the device allows enlarging the incident angle margin of the incident light.

Figure 9:
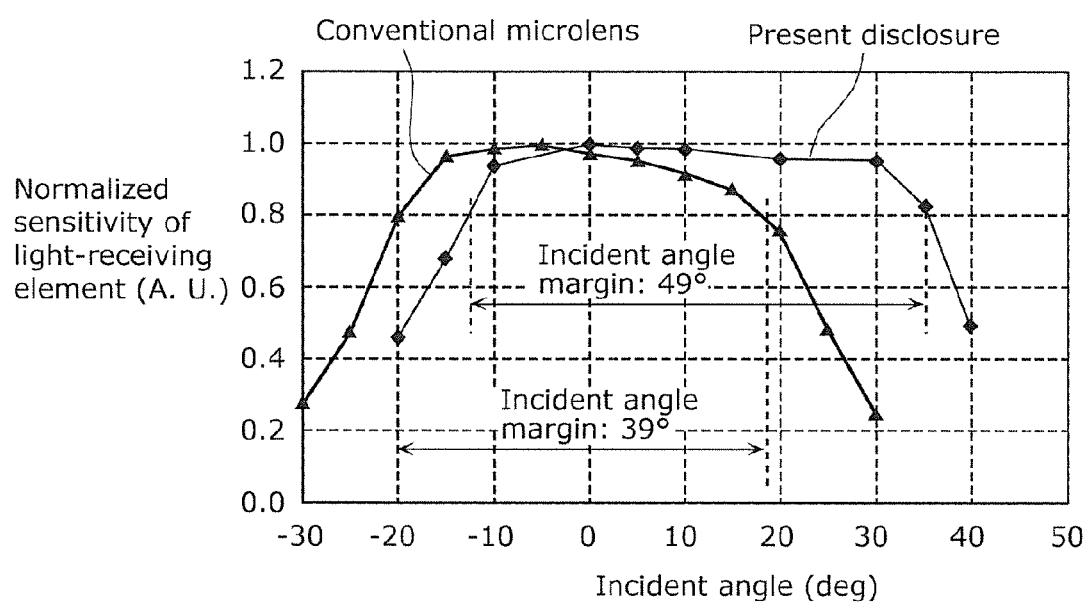
FIG. 9 shows incident angle dependency of light-receiving sensitivity of the light-receiving elements in the solid-state imaging device according to Embodiment 2.
Figure 10:
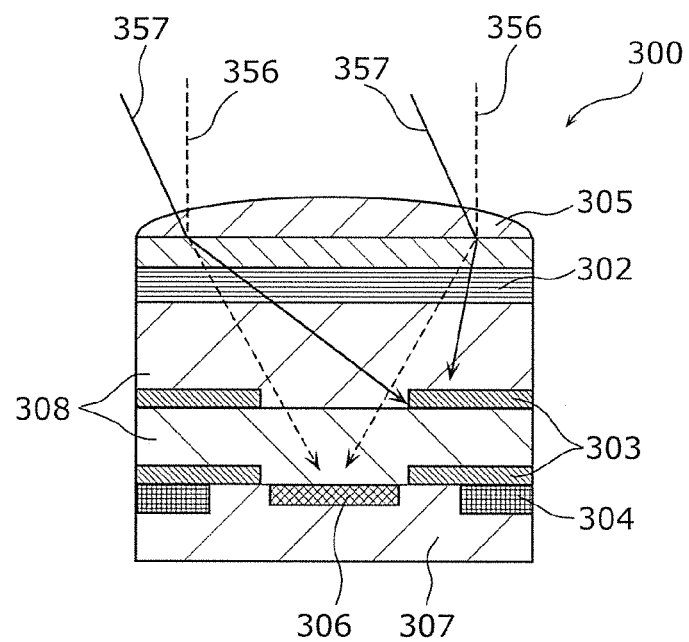
FIG. 10 shows an example of a structure of a conventional unit pixel.
Figure 11:
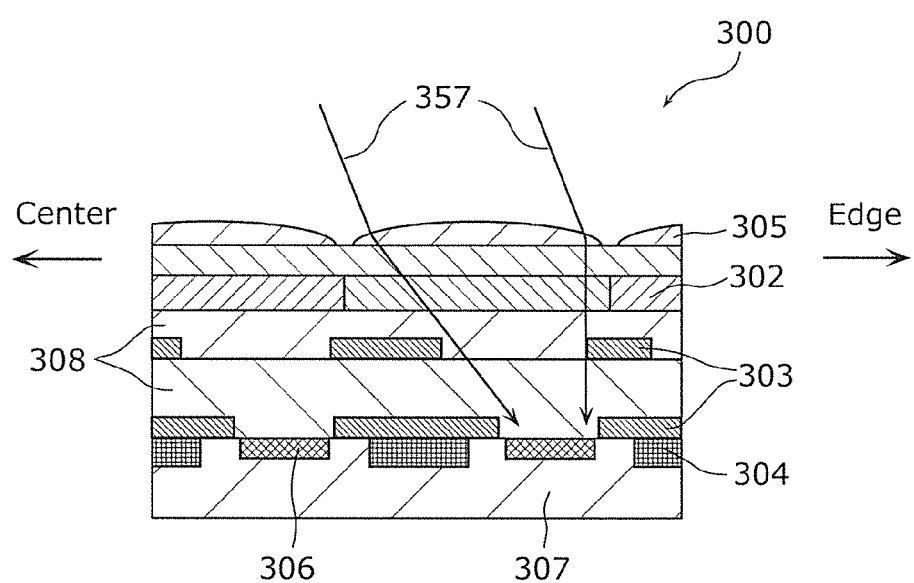
FIG. 11 shows an example of a structure of a conventional unit pixel.

FIG. 9 shows a graph showing the incident angle dependency of the light-receiving sensitivity of the light-receiving element 14 (normalized sensitivity of the light-receiving element 14) in the solid-state imaging device according to the present embodiment.

As shown in FIG. 9, the light-collecting element 14 indicated by "black diamonds" can collect the incident light having incident angle of a wide range, that is from approximately -10° to approximately 40°, with high efficiency (80% or more). It can be understood that the incident angle margin is increased remarkably as compared with the light-collecting element with the conventional microlens indicated by "black triangles".

As described above, with the solid-state imaging device according to the present embodiment, the incident angle margin of the incident light can be enlarged by using the light-collecting element 11 having the effective refractive index distribution as the inner-layer lens, and providing the microlens 20.

The above has described the solid-state imaging device and the imaging apparatus according to the present disclosure based on the embodiments. However, the present disclosure is not limited to these embodiments. Although only some exemplary embodiments of the present disclosure have been described in detail above, those skilled in the art will readily appreciate that many modifications are possible in the exemplary embodiments without materially departing from the novel teachings and advantages of the present disclosure. Moreover, structural elements in the embodiments may be optionally combined without departing from the spirit of the prevent disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be used for solid-state imaging devices, and particularly for digital still cameras, digital video cameras, and mobile phones with cameras, and is commercially useful.

The invention claimed is:

1. A solid-state imaging device comprising:
an imaging area; and
unit pixels arranged in a two-dimensional array in the imaging area, the unit pixels each having a light-receiving element and a light-collecting element,
wherein the light-collecting element includes a plurality of light-transmissive films concentrically arranged about an axis which extends in a direction perpendicular to a light-receiving surface of the light-collecting element, each light-transmissive film having a width shorter than or equal to a wavelength of light entering the light-receiving element; and
the light-collecting element has an effective refractive index distribution controlled according to a combination of the light-transmissive films,
the light-transmissive films include a first light-transmissive film which is closest to the axis of the concentrically-arranged light-transmissive films, an outer edge of the first light-transmissive film drawing a true circle in plan view, and a second light-transmissive film different from the first light-transmissive film, an outer edge of the second light-transmissive film drawing an ellipse in plan view,
a ratio of a major-axis to a minor-axis of the ellipse of the outer edge of the second light-transmissive film increases as the second light-transmissive film is farther away from the axis of the concentrically-arranged light-transmissive films, and the unit pixels include a first unit pixel disposed at a center of the imaging area and a second unit pixel different from the first unit pixel, and a direction of the major-axis of the ellipse of the second light-transimissive film in the second unit pixel is orthogonal to a vector which connects the axis of the second light-transmissive film and the center of the imaging area in plan view.

2. The solid-state imaging device according to claim 1, wherein the axis of the concentrically-arranged light-transmissive films in the first unit pixel matches a center of the first unit pixel, the axis of the concentrically-arranged light-transmissive films in the second unit pixel is shifted from a center of the second unit pixel toward the center of the imaging area, and an amount of a shift between the axis of the concentrically-arranged light-transmissive films in the second unit pixel and the center of the second unit pixel increases as the second unit pixel is farther away from the center of the imaging area.

3. The solid-state imaging device according to claim 1, wherein in the effective refractive index distribution on the light-receiving surface of the light-collecting element, an effective refractive index peaks at the axis of the concentrically-arranged light-transmissive films and decreases with distance from the axis of the concentrically-arranged light-transmissive films in a parabolic manner, and the effective refractive index distribution in a minor-axis direction of the ellipse on the light-receiving surface of the light-collecting element has a skewed distribution in which the effective refractive index decreases with fourth power of the distance from the axis of the concentrically-arranged light-transmissive films.

4. The solid-state imaging device according to claim 1, wherein the light-collecting element forms an inner-layer lens.

5. An imaging apparatus comprising the solid-state imaging device according to claim 1.

6. A solid-state imaging device comprising:

an imaging area; and unit pixels arranged in a two-dimensional array in the imaging area, the unit pixels each having a light-receiving element and a light-collecting element, wherein the light-collecting element includes a plurality of light-transmissive films concentrically arranged about an axis which extends in a direction perpendicular to a light-receiving surface of the light-collecting element, each light-transmissive film having a width shorter than or equal to a wavelength of light entering the light-receiving element; and the light-collecting element has an effective refractive index distribution controlled according to a combination of the light-transmissive films, the light-transmissive films include a first light-transmissive film, an outer edge of the first light-transmissive film drawing a first ellipse in plan view, and a second light-transmissive film different from the first light-transmissive film, an outer edge of the second light-transmissive film drawing a second ellipse in plan view, the first light-transmissive film is disposed closer to the axis of the concentrically-arranged light-transmissive films than the second light-transmissive film is, a ratio of a major-axis to a minor-axis of the second ellipse is greater than a ratio of a major-axis to a minor-axis of the first ellipse, and the unit pixels include a first unit pixel disposed at a center of the imaging area and a second unit pixel different from the first unit pixel, a direction of the major-axis of the ellipse of the first light-transmissive film in the second unit pixel is orthogonal to a vector which connects the axis of the first light-transmissive film and the center of the imaging area in plan view.

7. The solid-state imaging device according to claim 6, wherein the axis of the concentrically-arranged light-transmissive films in the first unit pixel matches a center of the first unit pixel, the axis of the concentrically-arranged light-transmissive films in the second unit pixel is shifted from a center of the second unit pixel toward the center of the imaging area, and an amount of a shift between the axis of the concentrically-arranged light-transmissive films in the second unit pixel and the center of the second unit pixel increases as the second unit pixel is farther away from the center of the imaging area.

8. The solid-state imaging device according to claim 6, wherein in the effective refractive index distribution on the light-receiving surface of the light-collecting element, an effective refractive index peaks at the axis of the concentrically-arranged light-transmissive films and decreases with distance from the axis of the concentrically-arranged light-transmissive films in a parabolic manner, and the effective refractive index distribution in a minor-axis direction of the first ellipse on the light-receiving surface of the light-collecting element has a skewed distribution in which the effective refractive index decreases with fourth power of the distance from the axis of the concentrically-arranged light-transmissive films.

9. The solid-state imaging device according to claim 6, wherein the light-collecting element forms an inner-layer lens.

10. An imaging apparatus comprising the solid-state imaging device according to claim 6.

11. A solid-state imaging device comprising:

an imaging area; and unit pixels arranged in a two-dimensional array in the imaging area, the unit pixels each having a light-receiving element and a light-collecting element, wherein the light-collecting element includes a plurality of light-transmissive films concentrically arranged about an axis which extends in a direction perpendicular to a light-receiving surface of the light-collecting element, each light-transmissive film having a width shorter than or equal to a wavelength of light entering the light-receiving element; and the light-collecting element has an effective refractive index distribution controlled according to a combination of the light-transmissive films, the light-transmissive films include a first light-transmissive film, an outer edge of the first light-transmissive film drawing an ellipse in plan view, and the unit pixels include a first unit pixel disposed at a center of the imaging area and a second unit pixel different from the first unit pixel, a direction of the major-axis of the ellipse of the first light-transmissive film in the second unit pixel is orthogonal to a vector which connects the axis of the first light-transmissive film and the center of the imaging area in plan view.

12. The solid-state imaging device according to claim 11, wherein the axis of the concentrically-arranged light-transmissive films in the first unit pixel matches a center of the first unit pixel, the axis of the concentrically-arranged light-transmissive films in the second unit pixel is shifted from a center of the second unit pixel toward the center of the imaging area, and an amount of a shift between the axis of the concentrically-arranged light-transmissive films in the second unit pixel and the center of the second unit pixel increases as the second unit pixel is farther away from the center of the imaging area.

13. The solid-state imaging device according to claim 11, wherein in the effective refractive index distribution on the light-receiving surface of the light-collecting element, an effective refractive index peaks at the axis of the concentrically-arranged light-transmissive films and decreases with distance from the axis of the concentrically-arranged light-transmissive films in a parabolic manner, and the effective refractive index distribution in a minor-axis direction of the ellipse on the light-receiving surface of the light-collecting element has a skewed distribution in which the effective refractive index decreases with fourth power of the distance from the axis of the concentrically-arranged light-transmissive films.

14. The solid-state imaging device according to claim 11, wherein the light-collecting element forms an inner-layer lens.

15. An imaging apparatus comprising the solid-state imaging device according to claim 11.

* * * * *